United States Patent
Wang

(10) Patent No.: US 7,754,980 B2
(45) Date of Patent: Jul. 13, 2010

(54) SUBSTRATE WITH MULTILAYER PLATED THROUGH HOLE AND METHOD FOR FORMING THE MULTILAYER PLATED THROUGH HOLE

(75) Inventor: Chien Hao Wang, Hsinchu County (TW)

(73) Assignee: Advanced Semiconductor Engineering, Inc. (TW)

( * ) Notice: Subject to any disclaimer, the term of this patent is extended or adjusted under 35 U.S.C. 154(b) by 736 days.

(21) Appl. No.: 11/620,031

(22) Filed: Jan. 4, 2007

(65) Prior Publication Data

US 2007/0199736 A1 Aug. 30, 2007

(30) Foreign Application Priority Data

Feb. 27, 2006 (TW) .............................. 95106584 A

(51) Int. Cl.
*H01R 12/04* (2006.01)
*H05K 1/11* (2006.01)

(52) U.S. Cl. ...................................... 174/266; 174/262

(58) Field of Classification Search .......... 174/262–266
See application file for complete search history.

(56) References Cited

U.S. PATENT DOCUMENTS

| 5,421,083 A | * | 6/1995 | Suppelsa et al. | ............... 29/852 |
| 6,605,551 B2 | | 8/2003 | Wermer et al. | |
| 6,937,120 B2 | * | 8/2005 | Fisher et al. | ................. 333/246 |

FOREIGN PATENT DOCUMENTS

| TW | 589729 | 6/2004 |
| TW | I 242783 | 11/2005 |

* cited by examiner

*Primary Examiner*—Ishwarbhai B Patel

(57) ABSTRACT

A structure with a multilayer plated through hole is disclosed. At least one dielectric layer formed by deposition and a conductive layer are formed in an original plated through hole (PTH). The dielectric layer partially covers wiring layers of the substrate to electrically isolate the PTH and the conductive layer to form a multilayer PTH so as to save PTH occupation space of the substrate. Preferably, the formation of the dielectric layer is electrophoretic deposition to control the deposition thickness in the PTH very even and thin, no drilling is necessary. Accordingly, it can increase electrical performance and decrease cross-talk effect.

4 Claims, 9 Drawing Sheets

SUBSTRATE WITH MULTILAYER PLATED THROUGH HOLE AND METHOD FOR FORMING THE MULTILAYER PLATED THROUGH HOLE

CROSS REFERENCE TO RELATED APPLICATION

This application claims the priority benefit of Taiwan Patent Application Serial Number 095106584 filed Feb. 27, 2006, the full disclosure of which is incorporated herein by reference.

BACKGROUND OF THE INVENTION

1. Field of the Invention

The present invention relates to a multilayer circuit board and the method for manufacturing the same, and more particularly, to a substrate with a multilayer plated through hole and the method for forming the multilayer plated through hole.

2. Description of the Related Art

In general, multilayer circuit boards are frequently used in most electronic devices as media for signal transmission, power supply and grounding. As the electronic devices get complex and have more function, the number of trace layers of the multilayer circuit boards and longitudinal electrical connections between the trace layers are becoming greater. Accordingly, it is required to form much more plated through holes (PTHs) as electrical channels between these trace layers.

The Taiwan Patent Publication Number 589729, entitled "SUBSTRATE WITH VIA HOLE HAVING SHIELDING FUNCTION AND FORMING THE SAME", discloses a substrate with via holes. The inner wall of the via hole is first formed with a barrel-shaped shielding layer and then covered by a dielectric layer. A signal channel is deployed in the via hole. The via hole is formed by first filling up the barrel-shaped shielding layer with a dielectric material and then drilling the dielectric material to form a hole. A signal channel is subsequently deployed in the hole. However, the way to form a via hole by drilling cannot precisely control the thickness of the resulting dielectric layer. This will cause the separation of the signal channel from the shielding layer to be non-uniform and even a short circuit. The way of forming a via hole by drilling is inappropriate to a substrate with a multilayer plated through hole.

The Taiwan Patent Number 1242783, entitled "CUT VIA STRUCTURE FOR AND MANUFACTURING METHOD OF CONNECTING SEPARATE CONDUCTORS", discloses a cut via structure. The cut via structure includes at least two separate conductors formed with a central hollow or filling structure. The gap between the separate conductors is formed in a vertically-cut or slanted-cut direction with respect to the cut via structure. In brief, it is to divide a via hole into two or more parts, and each of which is connected to at least one of top traces and bottom traces. However, when at the period of division of the via hole or even application to an end-product, such separation of one conductor from the other will result in a degradation of the via structure. A temperature change experienced by the substrate is likely to cause the via structure to be broken. The conventional coaxially paired via structure disclosed in above-identified patent has the disadvantage of high impedance and producing an induction. This is because the way of forming the dielectric layer is to fill up the via hole with a dielectric material and then drill the via hole. A signal channel is subsequently deployed in the via hole. This will cause the thickness of the resulting dielectric layer to be uneven and consequently result in the above-mentioned disadvantage.

SUMMARY OF THE INVENTION

It is an object of the present invention to provide a substrate with a multilayer plated through hole and a method for forming the multilayer plated through hole. The method for forming a multilayer plated through hole is to form a dielectric layer and a conductive layer on the inner surface of a through hole in a substrate by deposition. The dielectric layer covers a portion of the trace layers of the substrate and electrically isolates the conductive layer from the plated through hole so as to substantially reduce the room for the plated through holes and the size of the substrate. The multilayer plated through hole of the present invention can be used in a high-density substrate.

It is another object of the present invention to provide a substrate with a multilayer plated through hole and a method for forming the multilayer plated through hole. The method for forming a multilayer plated through hole is to form a dielectric layer by electrophoretic deposition. The dielectric layer can electrically isolate the conductive layer from the plated through hole. The resulting dielectric layer is uniformly thick and very thin and therefore there is no need to achieve an alignment for drilling. This will be able to increase the electrical performance of the plated through hole and eliminate the crosstalk.

In order to achieve the above objects, a substrate with a multilayer plated through hole according to the present invention includes a substrate body having a plated through hole, a dielectric layer and a conductive layer. The substrate body further includes a first trace layer and a second trace layer. The plated through hole electrically connects the first trace layer to the second trace layer. The dielectric layer is formed on the inner surface of the plated through hole by deposition and covers a portion of the first trace layer and a portion of the second trace layer. The conductive layer is formed on the dielectric layer and the dielectric layer electrically isolates the conductive layer from the plated through hole. Therefore, another plated through hole comprised of a dielectric layer and a conductive layer can likewise be formed in the previously formed plated through hole thereby constructing a configuration of multilayer plated through hole. This will be able to substantially reduce the room for the plated through holes and the size of the substrate. The multilayer plated through hole of the present invention can be used in a high-density substrate.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
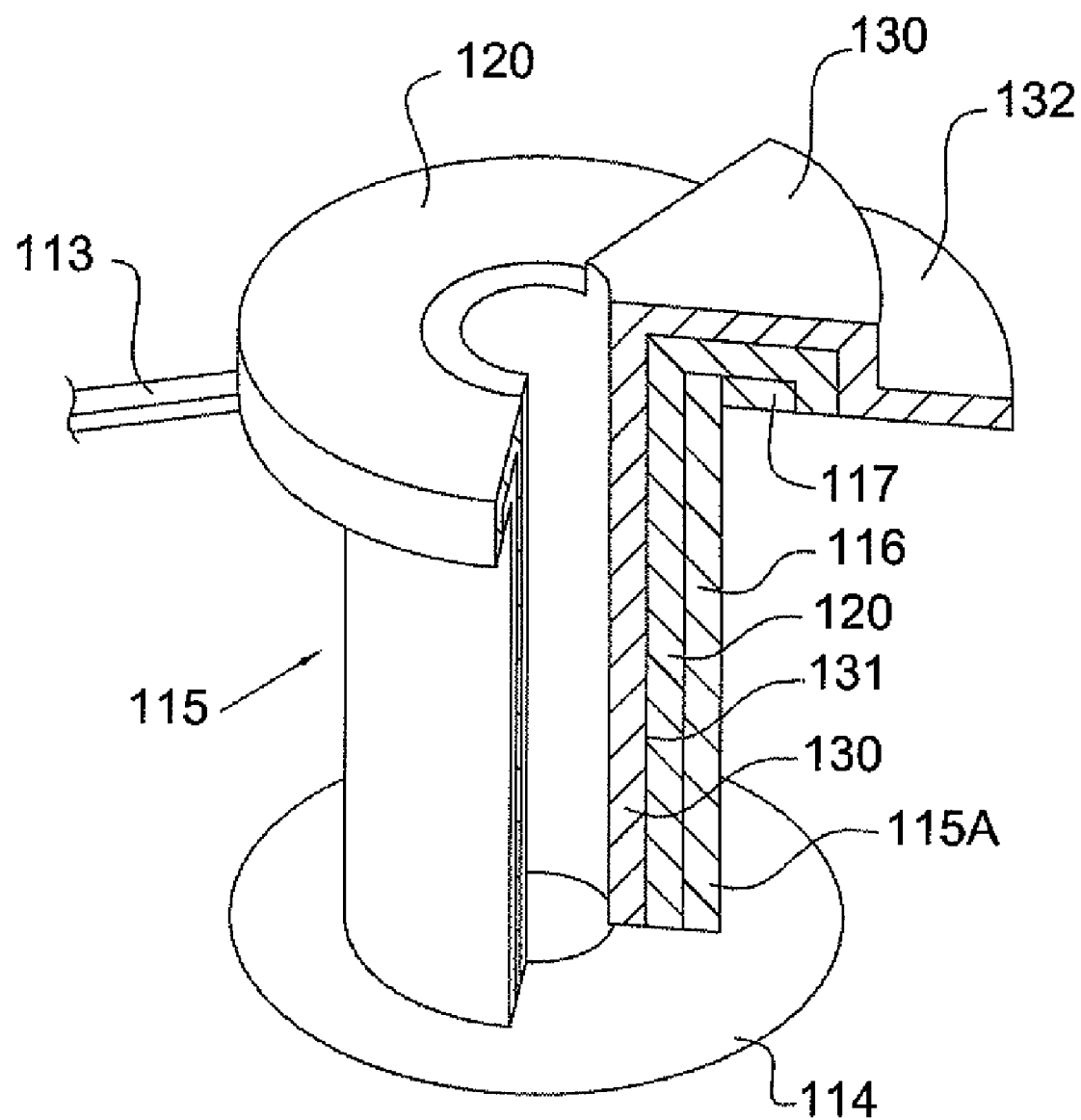
FIG. 1 is a perspective view of a substrate with a multilayer plated through hole according to the first embodiment of the present invention.
Figure 2:
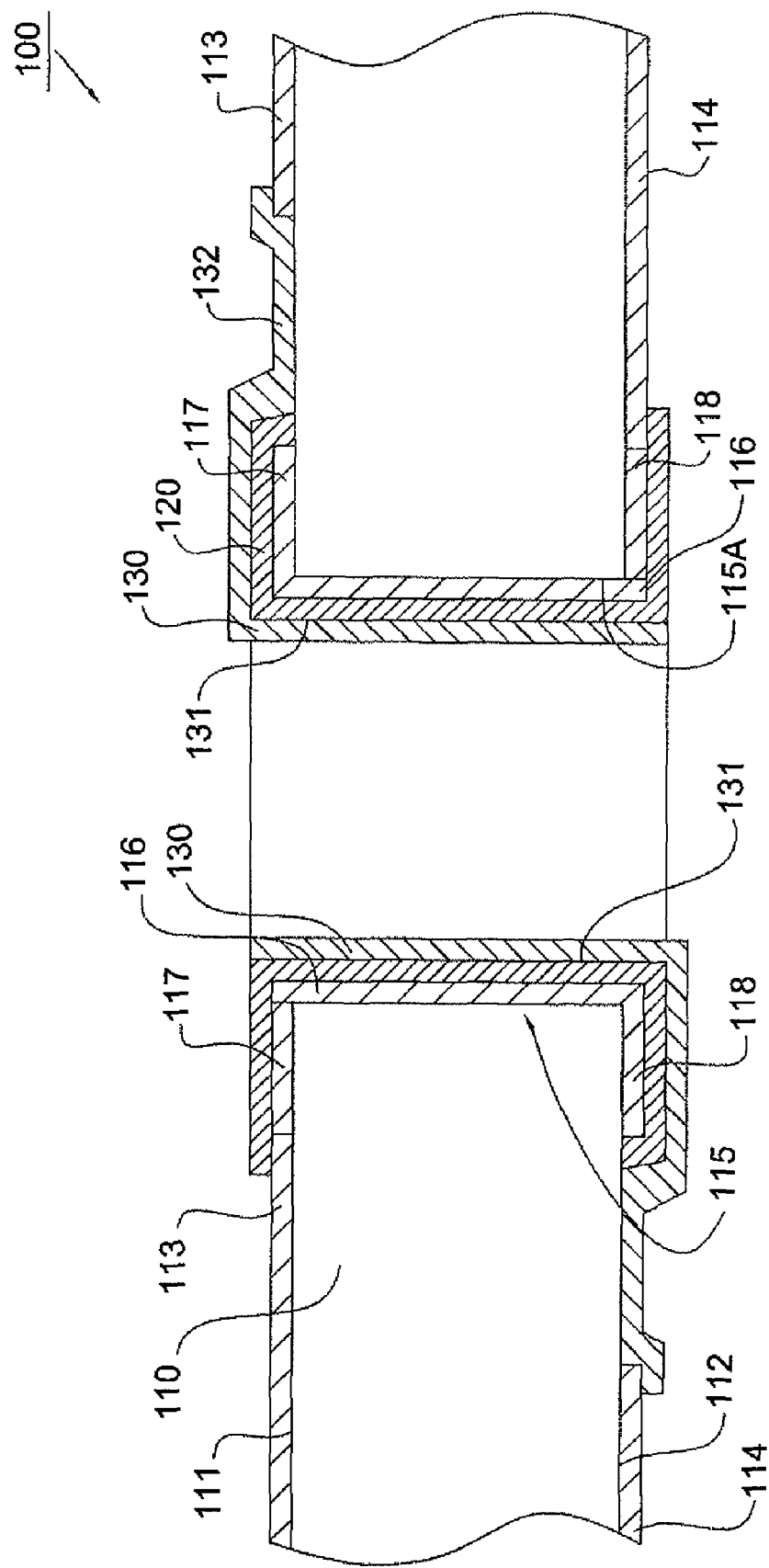
FIG. 2 is a cross-sectional view of a substrate with a multilayer plated through hole according to the first embodiment of the present invention.

Referring to FIGS. 1 and 2, a substrate 100 with a multilayer plated through hole according to an embodiment of the present invention includes a substrate body 110 having opposing upper and lower surfaces 111, 112. The substrate body 110 can be a multilayer printed circuit board. The substrate body 110 has a first trace layer 113, a second trace layer 114 and a plated through hole 115. The first trace layer 113 is formed on the upper surface 111 of the substrate body 110 and the second trace layer 114 is formed on the lower surface 112 of the substrate body 110. The plated through hole 115 passes through the upper surface 111 to the lower surface 112. The plated through hole 115 includes an electroless plating layer 115A and a first conductive layer 116 that the two layers 115A and 116 electrically connect the first trace layer 113 to the second trace layer 114. In this embodiment, the first trace layer 113 includes a first terminal 117 and the second trace layer 114 includes a second terminal 118. The first conductive layer 116 connects the first and second terminals 117, 118.

At least another plated through hole comprised of a dielectric layer 120 and a second conductive layer 130 is formed on the inner surface of the plated through hole 115, wherein the dielectric layer 120 is formed on the inner surface of the plated through hole 115 by deposition and covers a portion of the first trace layer 113 and a portion of the second trace layer 114. In order to make the resulting dielectric layer 120 uniformly thick and thinner, preferably, the dielectric layer 120 is formed by electrophoretic deposition. The dielectric layer 120 has a thickness of 10 to 50 μm and therefore does not obstruct the plated through hole 115. In addition, the dielectric layer 120 can be selectively electrophoretically deposited only on the exposed surface of the metal portion and therefore does not obstruct the plated through hole 115 and cause a short circuit. The second conductive layer 130 is formed on the dielectric layer 120 and electrically isolated from the first conductive layer 116 of the plated through hole 115 by the dielectric layer 120. Furthermore, in this embodiment, the dielectric layer 120 completely covers the first terminal 117, second terminal 118 and first conductive layer 116. The dielectric layer 120 is generally H-shaped and the central portion of the H-shaped dielectric layer 120 connecting the two generally parallel portions of the H-shaped dielectric layer 120 is hollow and of uniform inner diameter so as to provide a good electrical isolation and make ease of forming the second conductive layer 130.

As shown in FIG. 2, the second conductive layer 130 is formed on the dielectric layer 120 and has an extending portion 132 extending to the upper surface 111 of the substrate body 110. The extending portion 132 can also connect to the first trace layer 113. In addition, the second conductive layer 130 is formed on the inner surface of the plated through hole 115 and electrically isolated from other layers by the dielectric layer 120 to allow different signals to be simultaneously transmitted in both the first and second conductive layers 116, 130. The multilayer plated through hole 115 of the present invention will be able to substantially reduce the room for the plated through holes and be used in a high-density substrate.

Figure 3A:
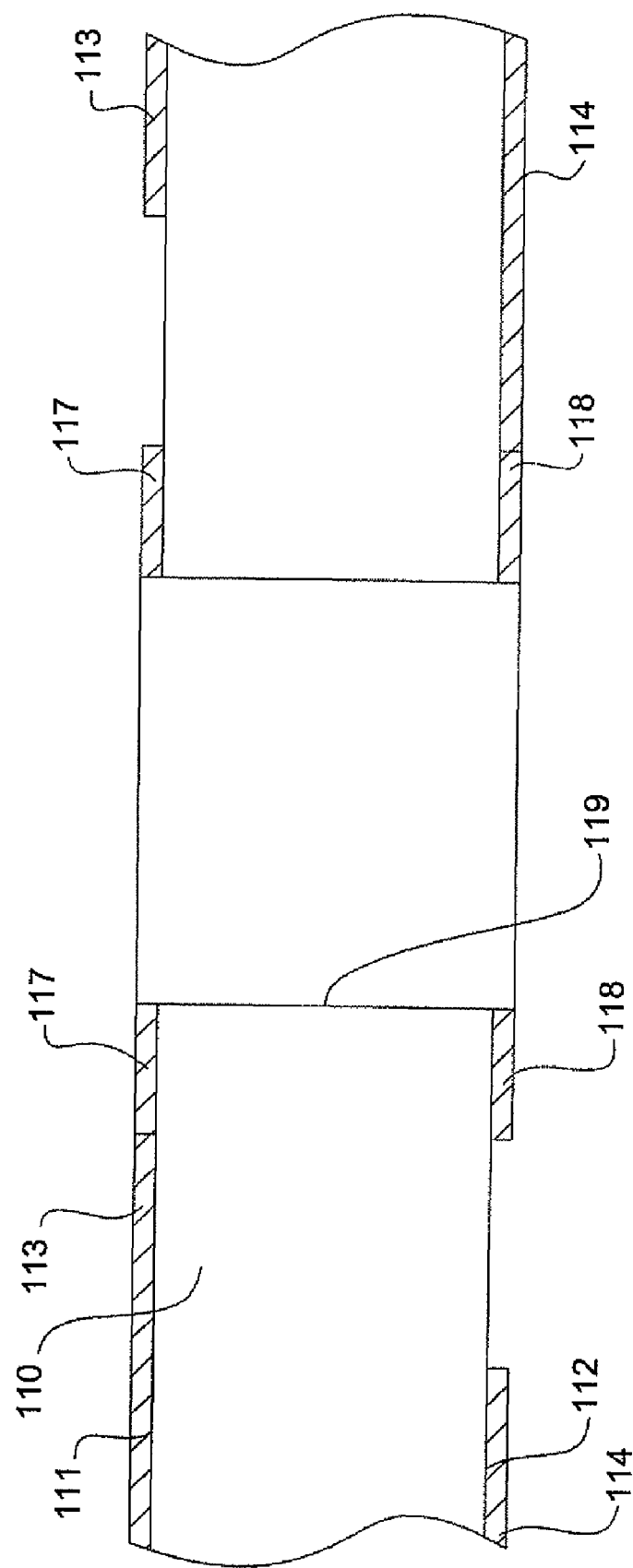
FIGS. 3a to 3e are cross-sectional views illustrating the method for forming the multilayer plated through hole of FIG. 2.
Figure 3B:
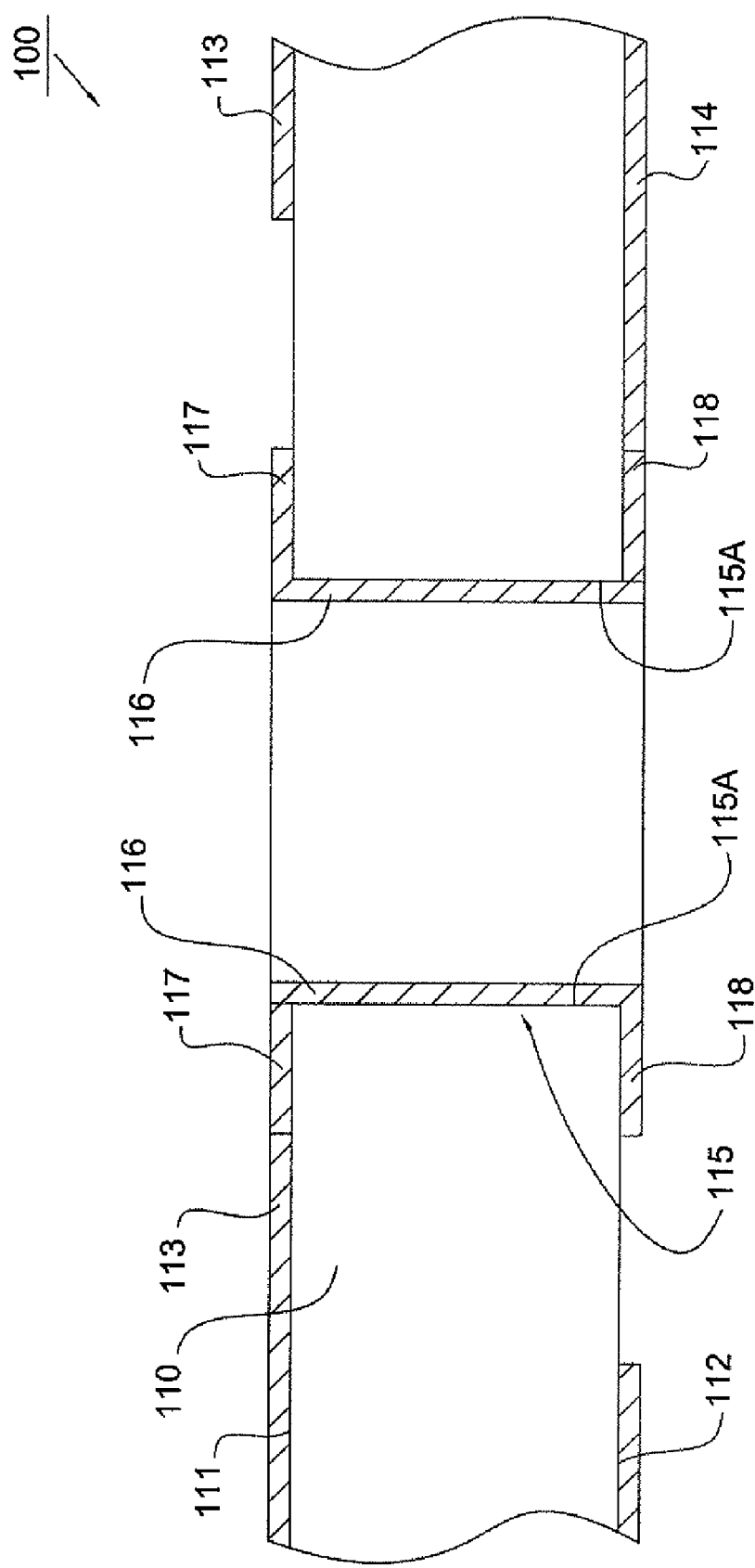

Refer to FIGS. 3a to 3e, they illustrate a method for forming the substrate 100 with a multilayer plated through hole according to an embodiment of the present invention. First, as shown in FIG. 3a, the substrate body 110 is provided. The substrate body 110 has the first and second trace layers 113, 114 and a through hole 119 is formed in the substrate body 110 by mechanical or laser drilling. The through hole 119 passes through the upper surface 111 of the substrate body 110 to the lower surface 112 of the substrate body 110. As shown in FIG. 3b, a layer of copper is deposited on the inner surface of the through hole 119 by electroless plating and plating techniques to form the plated through hole 115 with the electroless plating layer 115A and first conductive layer 116. The plated through hole 115 electrically connects the first trace layer 113 to the second trace layer 114. In this step, the plated through hole 115 is hollow and not filled up. The first conductive layer 116 is exposed on the inner surface of the plated through hole 115.

Figure 3C:
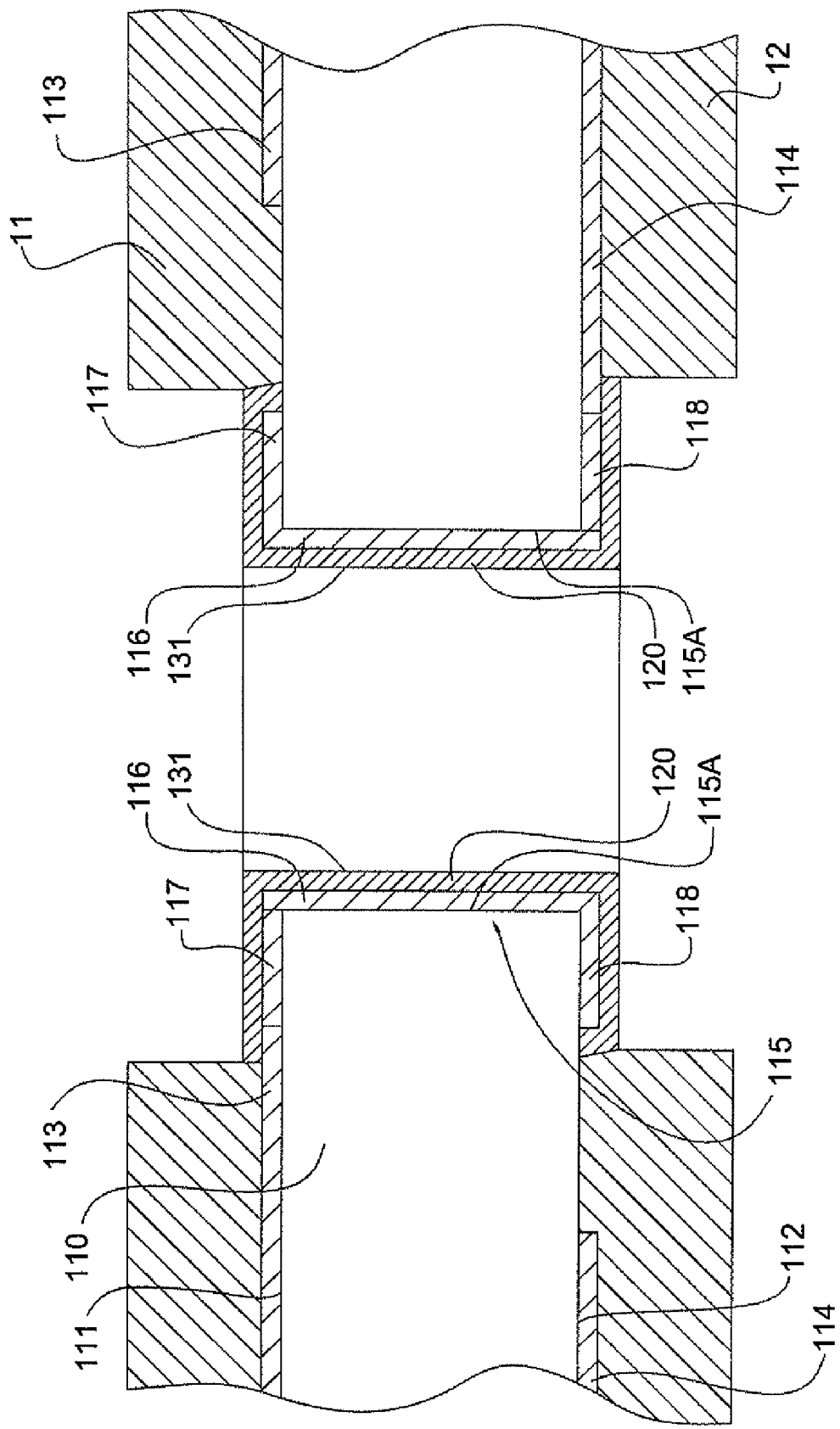
Figure 5:
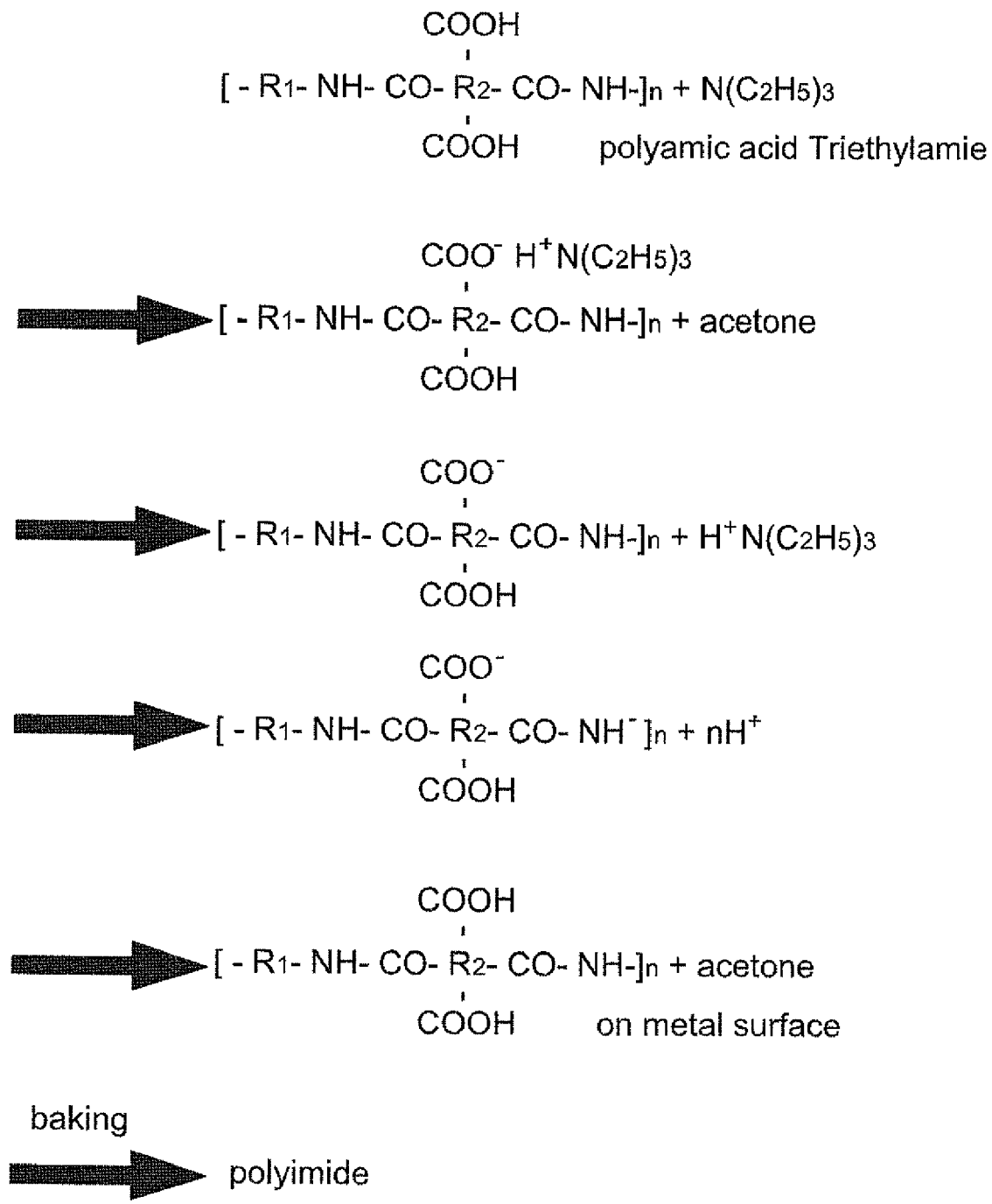
FIG. 5 illustrates the reaction mechanism of forming the dielectric layer of FIG. 2 by electrophoretic deposition.

As shown in FIG. 3c, dry films 11, 12 are respectively formed on the upper surface 111 and lower surface 112 of the substrate body 110. After exposure and development, the dry films 11, 12 cover respectively a portion of the first trace layer 113 and a portion of the second trace layer 114 and expose the first conductive layer 116, first terminal 117 and second terminal 118. Afterward, the dielectric layer 120 is formed on the first conductive layer 116, first terminal 117 and second terminal 118 by electrophoretic deposition. In this embodiment, the dielectric layer 120 is made of polyimide (PI). The polyimide precursor is first formed on the surface of the metal portion by electrophoretic deposition and then baked to form the polyimide. The reaction mechanism of forming the dielectric layer 120 by electrophoretic deposition is illustrated in FIG. 5.

Figure 3D:
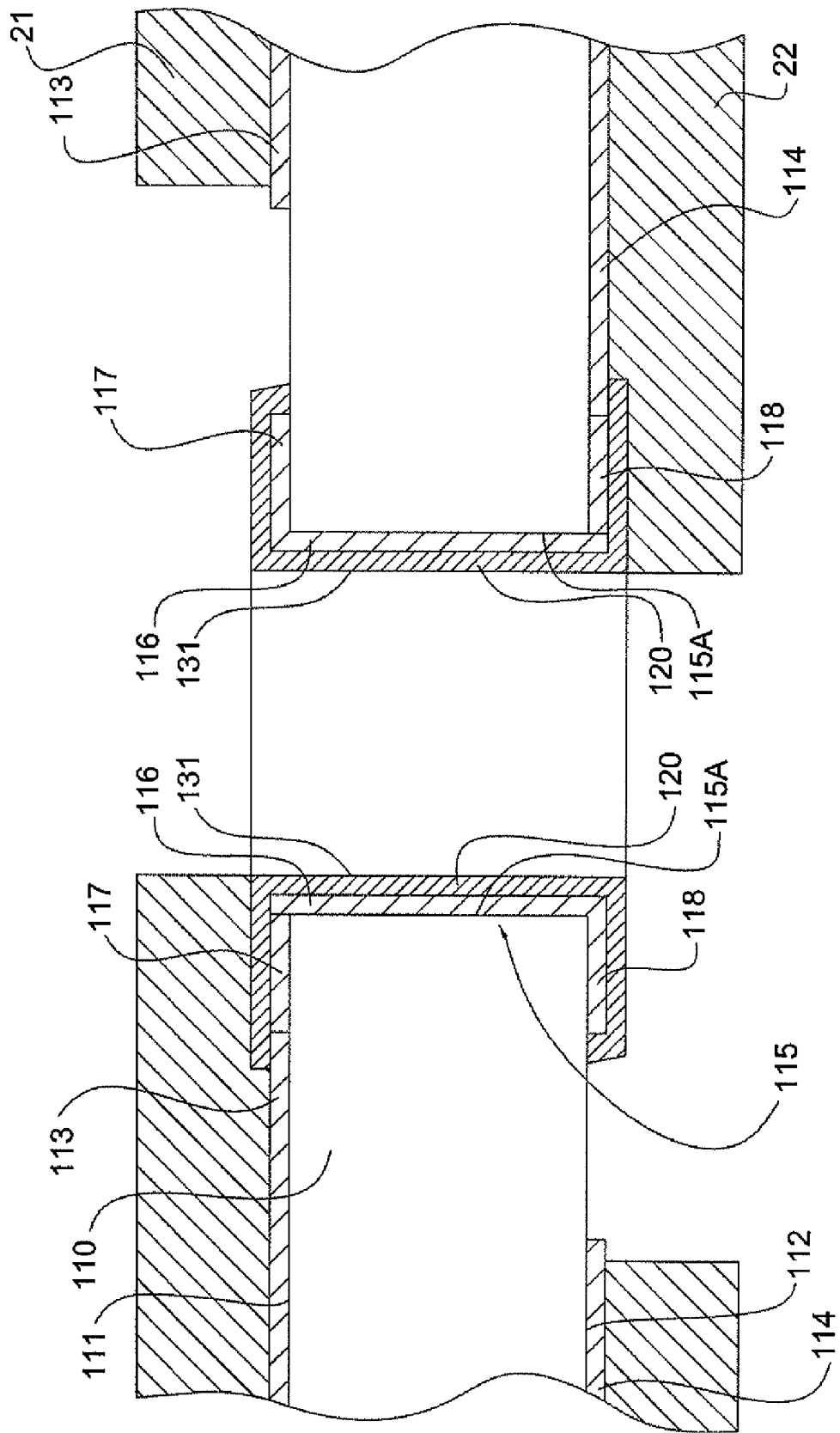
Figure 3E:
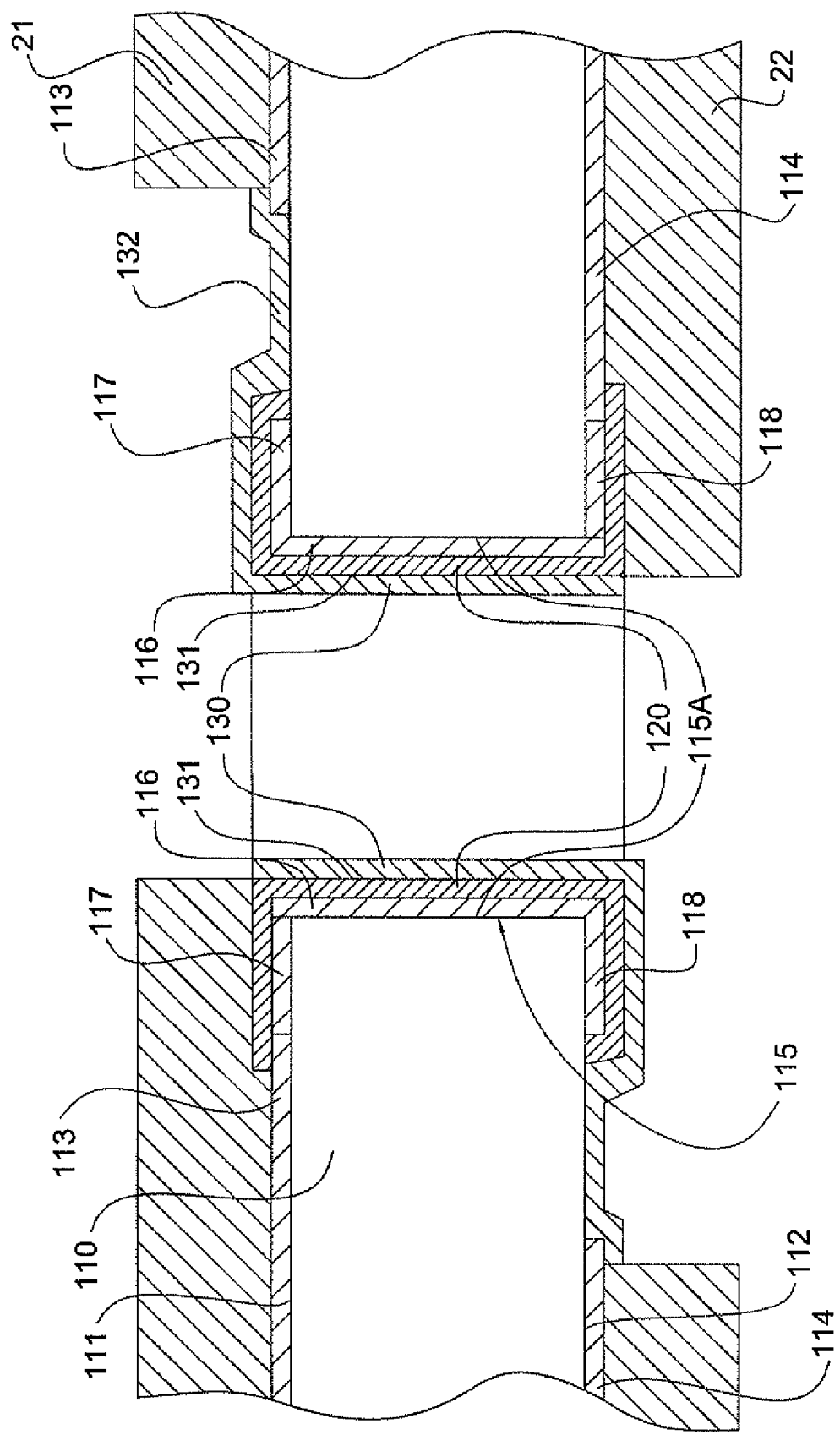

After removing the dry films 11, 12, as shown in FIG. 3d, dry films 21, 22 are respectively formed on the upper surface 111 and lower surface 112 of the substrate body 110. In this embodiment, after exposure and development, the dry films 21, 22 expose a portion of the dielectric layer 120, a portion of the upper surface 111 and a portion of the lower surface 112. Afterward, an electroless plating layer 131 is formed on the exposed portions of the dielectric layer 120, upper surface 111 and lower surface 112. As shown in FIG. 3e, the second conductive layer 130 is then formed on the electroless plating layer 131 by plating. The second conductive layer 130 is electrically isolated from the first conductive layer 116 and electrically connects the first trace layer 113 to the second trace layer 114. Last, the dry films 21, 22 are removed and the substrate body 110 is prepared by thermal lamination, plating or otherwise to form the substrate 100 having a multilayer plated through hole.

Figure 4:
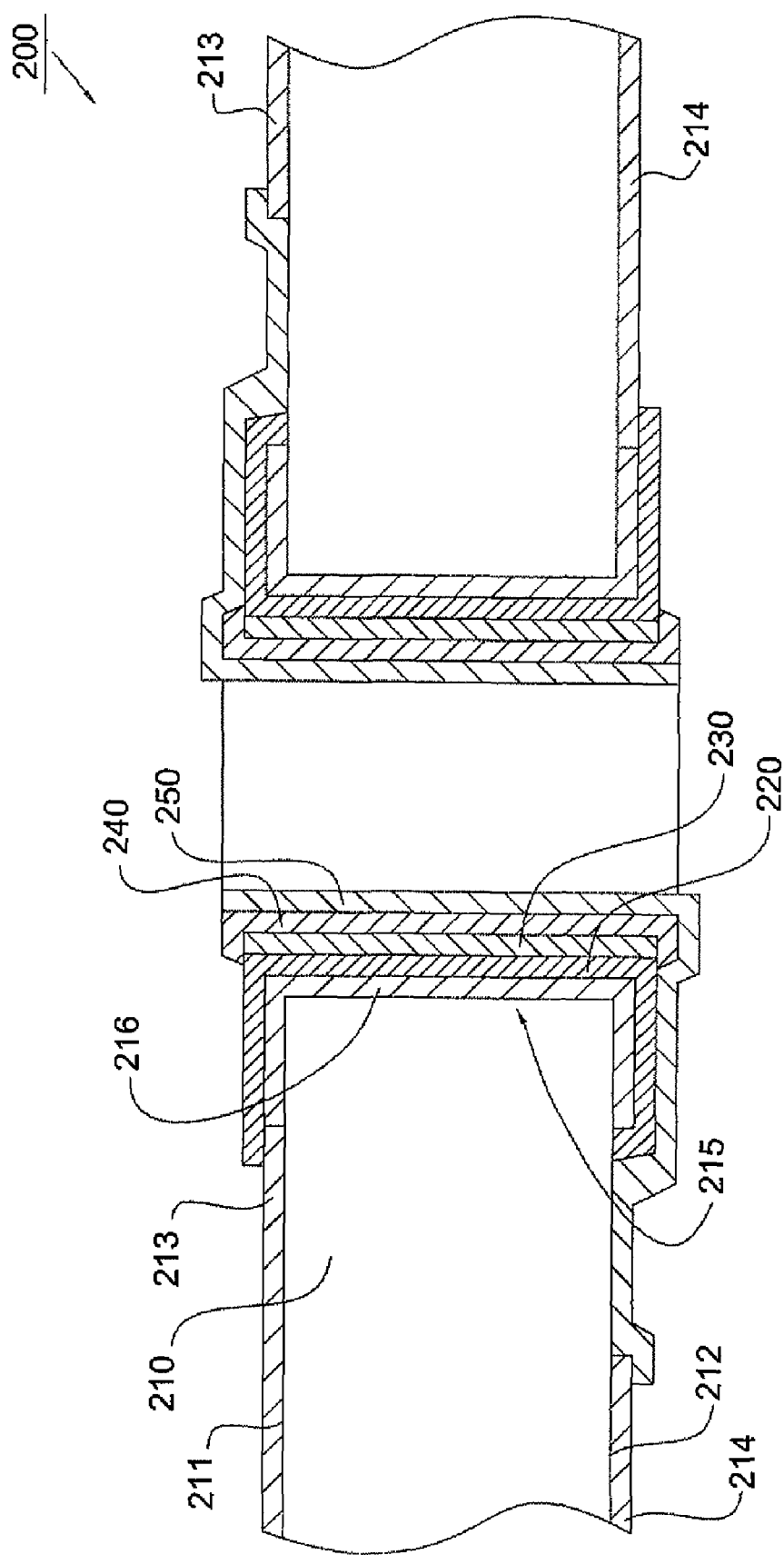
FIG. 4 is a cross-sectional view of a substrate with a multilayer plated through hole according to the second embodiment of the present invention.

Referring to FIG. 4, a substrate 200 with a multilayer plated through hole according to another embodiment of the present invention includes a substrate body 210 having opposing upper and lower surface 211, 212. The substrate body 210 has a first trace layer 213, a second trace layer 214 and a plated through hole 215. A series of conductive layers and dielectric layers are formed on the inner surface of the plated through hole 215 in order. The plated through hole 215 includes a first conductive layer 216 formed on the inner surface thereof and the first conductive layer 216 electrically connects the first trace layer 213 to the second trace layer 214. A first dielectric layer 220 is formed on the inner surface of the plated through hole 215 by deposition and covers a portions of the first trace layer 213 and a portion of the second trace layer 214. A second conductive layer 230 is formed on the first dielectric layer 220 and electrically isolated from the first conductive layer 216 by the first dielectric layer 220. In this embodiment, the second conductive layer 230 is a metal shielding layer that is electrically independent or connected only to the grounding of the substrate 200. A second dielectric layer 240 is formed in the plated through hole 215 and on the second conductive layer 230 by deposition. A third conductive layer 250 is formed in the plated through hole 215 and on the second dielectric layer 240. The second dielectric layer 240 electrically isolates the second conductive layer 230 from the third conductive layer 250. The third conductive layer 250 is in electrical contact with the first trace layer 213 and the second trace layer 214. The second conductive layer 230 can eliminate a crosstalk between the first conductive layer 216 and third conductive layer 250 thereby increasing the electrical performance of the plated through hole 215 in the substrate 200.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A substrate with a multilayer plated through hole, comprising:
    a substrate body having a first trace layer, a second trace layer, and a plated through hole, the plated through hole having a first conductive layer electrically connecting the first trace layer to the second trace layer;
    a first dielectric layer formed in the plated through hole, the first dielectric layer covering a portion of the first trace layer and a portion of the second trace layer; and
    a second conductive layer formed on the first dielectric layer and extending to be in direct contact with the substrate body, the second conductive layer electrically connecting to the first trace layer, the first dielectric layer electrically isolating the second conductive layer from the first conductive layer.

2. The substrate as claimed in claim 1, wherein the first trace layer comprises a first terminal and the second trace layer comprises a second terminal, the first conductive layer connects the first and second terminals, the first dielectric layer completely covers the first terminal, second terminal and first conductive layer.

3. The substrate as claimed in claim 1, further comprising:
    a second dielectric layer formed in the plated through hole; and
    a third conductive layer formed in the plated through hole, wherein the second dielectric layer electrically isolates the second conductive layer from the third conductive layer.

4. The substrate as claimed in claim 1, further comprising:
    an electroless plating layer formed between the first dielectric layer and second conductive layer.

\* \* \* \* \*